United States Patent [19]

Shibata et al.

[11] Patent Number: 5,539,329
[45] Date of Patent: Jul. 23, 1996

[54] PROGRAMMABLE LOGIC CIRCUIT W/NEURON MOS TRANSISTORS

[76] Inventors: Tadashi Shibata, 2-5, Nihondaira, Taihaku-ku, Sendai-shi, Miyagi-ken; Tadhiro Ohmi, 1-17-301, Komegabukuro 2-chome, Aoba-ku, Sendai-shi Miyagi-ken 980, both of Japan

[21] Appl. No.: 387,844

[22] Filed: Feb. 21, 1995

[30] Foreign Application Priority Data

Aug. 26, 1992 [JP] Japan ................................. 4-226322

[51] Int. Cl.⁶ ............................................. H03K 19/173
[52] U.S. Cl. ................................ 326/39; 326/41; 326/45
[58] Field of Search .............................. 326/38, 39, 44, 326/45, 49, 50, 119

[56] References Cited

U.S. PATENT DOCUMENTS

| | | | |
|---|---|---|---|
| 4,644,187 | 2/1987 | Haji | 326/44 |
| 4,870,302 | 9/1989 | Freeman | 326/45 |
| 4,961,002 | 10/1990 | Tam | 307/201 |
| 5,021,693 | 6/1991 | Shima | 307/201 |
| 5,053,993 | 10/1991 | Miura | 326/45 |
| 5,258,657 | 11/1993 | Shibata | 326/35 |
| 5,341,041 | 8/1994 | El Gamal | 326/44 |
| 5,367,208 | 11/1994 | El Gamal | 326/44 |

FOREIGN PATENT DOCUMENTS

| | | |
|---|---|---|
| 2-113494 | 4/1990 | Japan . |
| 2-224190 | 9/1990 | Japan . |
| 2-281759 | 11/1990 | Japan . |
| 3-6679 | 1/1991 | Japan . |

*Primary Examiner*—Edward P. Westin
*Assistant Examiner*—Andrew Sanders
*Attorney, Agent, or Firm*—Baker & Daniels

[57] ABSTRACT

A semiconductor integrated circuit adaptable to any logic circuits using a common mask with the exception of a mask of metallic wirings so as to drastically improve performance of custom LSIs. The semiconductor integrated circuit comprises a logic circuit having a plurality of input terminals and at least one output terminal. The logic circuit includes a plurality of circuit blocks of the same circuit construction. Each of the circuit blocks has at least two stages of inverter formed by MOS semiconductor devices and at least one layer of a wiring pattern having a different pattern. The output signal of each block is defined by a predetermined function of an input signal.

5 Claims, 7 Drawing Sheets

FIG_1a

FIG_1b

FIG_1c

FIG_1d

FIG_1e

FIG_1f

FIG_1g

FIG_1h

FIG_1i

FIG_3a $(X_1, X_2, X_3): (000) \begin{pmatrix}001\\010\\100\end{pmatrix} \begin{pmatrix}011\\101\\110\end{pmatrix} (111)$

FIG_3b

FIG_3c

FIG_3d

FIG_3e

5,539,329

PROGRAMMABLE LOGIC CIRCUIT W/NEURON MOS TRANSISTORS

TECHNICAL FIELD

The Present invention relates to a semiconductor integrated circuit, and in particular, provides novel custom LSIs capable of realizing a variety of logical functions using essentially identical circuit patterns.

TECHNOLOGICAL BACKGROUND

The degree of integration of semiconductor integrated circuits has increased year by year in concert with development in the miniaturization of transistors. As the degree of integration has increased, the logical LSI functions realizable on one chip have increased dramatically.

As a result, 32 and 64 bit microprocessors have been developed and installed in industrial and consumer apparatuses, and an extremely high degree of control has been conducted. However, the method in which predetermined control is conducted by programming general purpose chips such as microprocessors in accordance with the respective purpose has the drawback that, in general, processing speed is reduced.

Specialized LSI chips which are developed so as to conform to specific applications and which are incorporated into the appropriate systems, that is to say, the so-called custom LSIs, have thus increased in importance; however, it is currently the case that an enormous amount of time and cost is associated with the development of specialized chips, and such development is incapable of meeting the needs of a rapidly developing world.

Furthermore, in semiconductor manufacturing facilities which produce chips, in order to produce a variety of custom LSIs, it is necessary to store a large number of LSI pattern originals (termed reticles), and to conduct the manufacturing of LSIs by, where necessary, setting these in a stepper (a pattern projection transfer apparatus); this causes problems such as a marked decrease in manufacturing efficiency, in particular in view of the time required for the changing of the reticles.

Accordingly, the development of technology by which a variety of custom LSIs can be produced using, in so far as possible, identical reticles, has been desired.

An example of technology meeting these requirements is the gate array. A gate array is constructed by arranging a plurality of identical circuit blocks, wherein two NMOS and PMOS transistors are formed into a group, on a chip. The necessary logical function is then realized by appropriately connecting these transistors by means of a conductive wiring pattern such as Al or the like. This technology is capable of forming simple circuits, such as AND, NAND, OR, and NOR circuits, comparatively easily; however, if an attempt is made to realize higher functions, a large number of transistors become necessary, and the formation of an extremely complex wiring pattern is required. For example, 38 transistors are required in order to realize a simple 3-input EXCLUSIVE NOR circuit.

For this reason, the gate array technology lacks flexibility when used to construct various logic circuits, and furthermore, it is also inferior to custom LSIs from the point of view of function integration, so that this technology has recently come to be employed only rarely.

However, there is no appropriate technology other than the gate array for special uses in which only a small number of chips are required, so that this technology is still employed in a limited fashion.

However, time is required for the design which is necessary in order to realize the logical functions, so that, needless to say, this causes a delay in technological improvements. Among technologies which permit the simple execution of design, there is also the PLA (Programmable Logic Array), which permits the direct realization of function formulas expressed in Boolean algebra on a chip by means of disconnecting fuses and the like; however, this is limited to a small scale. Furthermore, there are also problems with the high speed operation and reliability of the circuitry.

DISCLOSURE OF THE INVENTION

The present invention was created in order to solve the problems discussed above; it has as an object thereof to provide a semiconductor integrated circuit which is capable of realizing an extremely high degree of custom LSI in a simple manner.

The semiconductor integrated circuit in accordance with the present invention contains as at least a portion thereof a logic circuit having a plurality of input terminals and at least one output terminal, and which comprises a plurality of circuit blocks having the same circuit construction, wherein the circuit blocks have at least two stages of inverters formed by MOS semiconductor devices and are provided with at least one layer of a wiring pattern having a pattern which differs, where necessary, in each block, and wherein the function type of the output signal of each block is defined so as to be a predetermined function of an input signal by means of the wiring pattern.

FUNCTION

By means of the present invention, it is possible to construct any logic circuit using a common mask with the exception of a mask of metallic wiring, and to dramatically improve the performance of custom LSIs.

(Description of the References)

| | |
|---|---|
| 101a–101f | circuit blocks, |
| 102 | wiring between blocks, |
| 103a | N-channel neuron MOS transistor (vMOS), |
| 103b | P-channel vMOS, |
| 103c | CMOS inverter, |
| 103-1, 103-2, 103-3, 103-4, 103-5 | input gates, |
| 103-6 | floating gate, |
| 104, 105, 106 | vMOS inverters, |
| 104-1, 104-2, 104-3, 104-4, 104-5, 104-6 | input gates, |
| 104-7 | floating gate, |
| 107 | CMOS inverter, |
| 201 | P-type silicon substrate, |
| 202, 203 | source and drain formed from $N^+$ diffusion layers, |
| 204 | gate insulating film (for example, a $SiO_2$ film), |
| 205 | channel region between source and drain, |
| 206 | electrically insulated, potentially floating state, |
| 207 | insulating film such as $SiO_2$ or the like. |

BEST MODE FOR CARRYING OUT THE INVENTION

Hereinbelow, the embodiments will be explained with reference to the Figures.

Figure 1A:
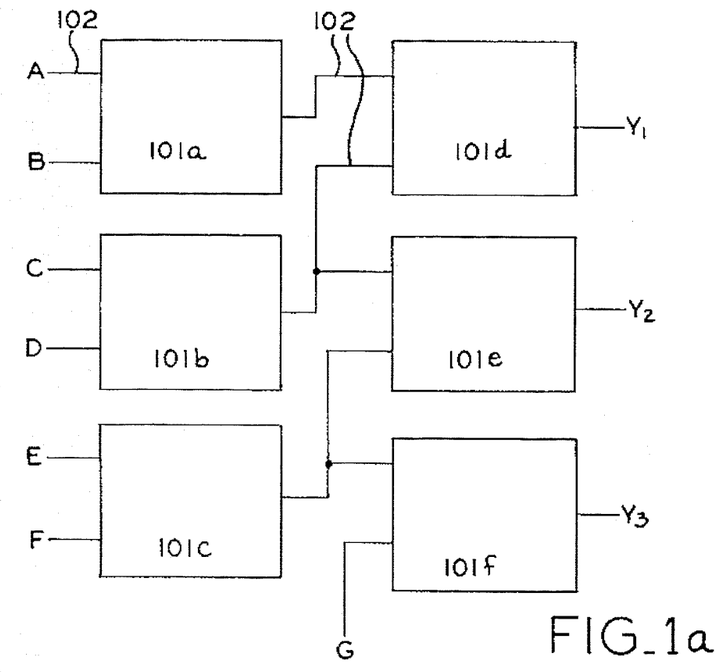
FIG. 1(a) is a circuit diagram showing a first example of the present invention.

FIG. 1(a) is a circuit diagram showing a first embodiment of the present invention.

Figure 1B:
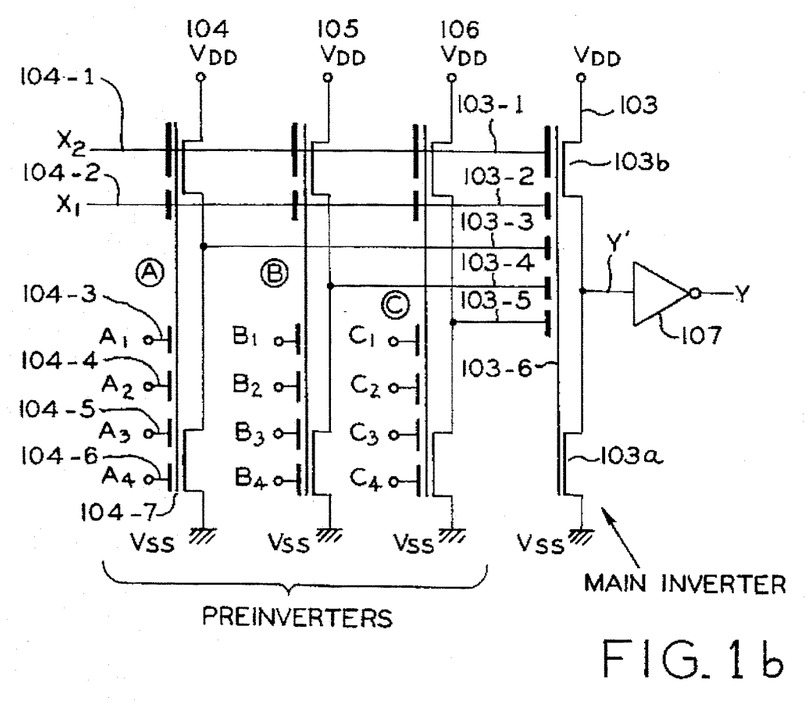
FIG. 1(b) is a diagram showing the structure of a block.

Six circuit blocks 101a–101f having the same circuit construction are shown as an example, and the wiring 102 between blocks is also depicted. The wiring 102 is, for example, formed by the aluminum wiring pattern which is the final pattern in the LSI production process. References $Y_1$, $Y_2$, and $Y_3$ indicate output terminals of the logic circuit. With the exception of all wiring patterns (in the present example, the aluminum wiring pattern), each block has exactly the same construction; the construction of the blocks is shown, for example, in. FIG. 1(b). In the Figure, reference 103 is a CMOS inverter comprising a N-channel neuron MOS transistor (vMOS) 103a and a P-channel vMOS (103b); this is termed the main inverter. The coupling capacity between the input gates 103-1, 103-2, 103-3, 103-4, and 103-5 thereof and the floating gate 103-6 thereof is such that $C_1:C_2:C_3:C_4:C_5=2:1:2:1:1$. References 104, 105, and 106 indicate identical vMOS inverters, and these are termed inverters A, B, and C.

In inverter A, the coupling capacity between input gates 104-1, 104-2, 104-3, 104-4, 104-5, and 104-6 and floating gate 104-7 is such that $C_1:C_2:C_3:C_4:C_5:C_6=2:1:1:1:1:1$, and this is identical. In the case of inverters B and C as well. As inverters A, B, and C apply signals to the main inverter 103, they are termed preinverters.

Reference 107 indicates a common CMOS inverter; this inverts the output Y' of the main inverter 103 and outputs output signal Y.

This circuit block outputs one signal Y with respect to two inputs $X_1$ and $X_2$. Y has the value shown below:

$$Y=f(X_1, X_2) \quad (1)$$

so that the result of performing a specified Boolean function with respect to a two-bit binary input $X_1$, $X_2$ is output. The form of the Boolean function is indicated by connecting each of the terminals of the input signals $A_1$–$A_4$, $B_1$–$B_4$, and $C_1$–$C_4$ of the preinverters to $V_{DD}$ or $V_{SS}$. That is to say, the function can be determined simply by the aluminum wiring pattern which determines the connection state of the input terminals. In actuality, it is possible to realize all sixteen Boolean functions with respect to the two input signals $X_1$ and $X_2$ with the circuitry of FIG. 1(b).

Figure 2A:
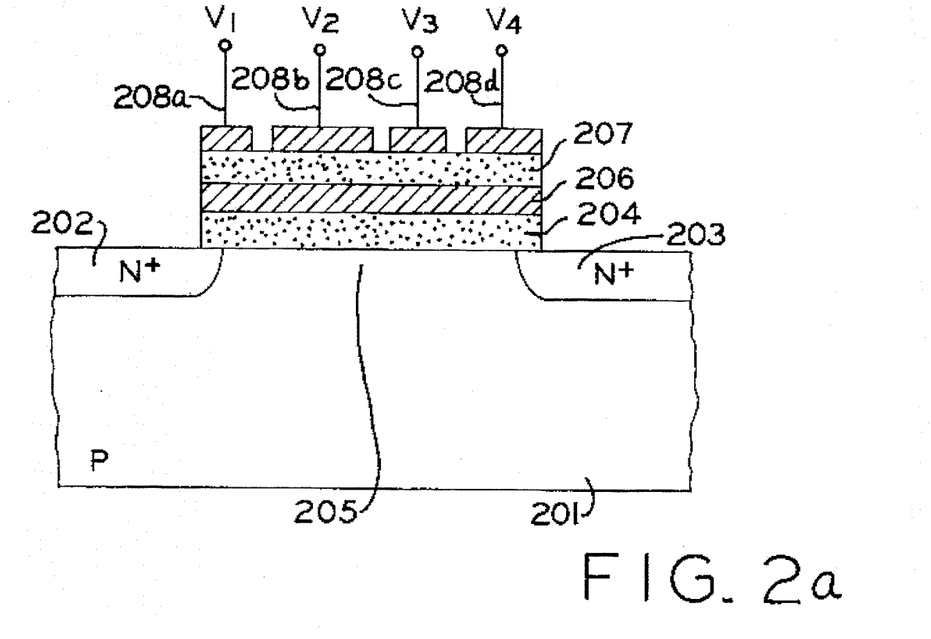
FIG. 2(a) shows an example of the cross-sectional structure of a 4-input N-channel vMOS transistor (N-vMOS).
Figure 2B:
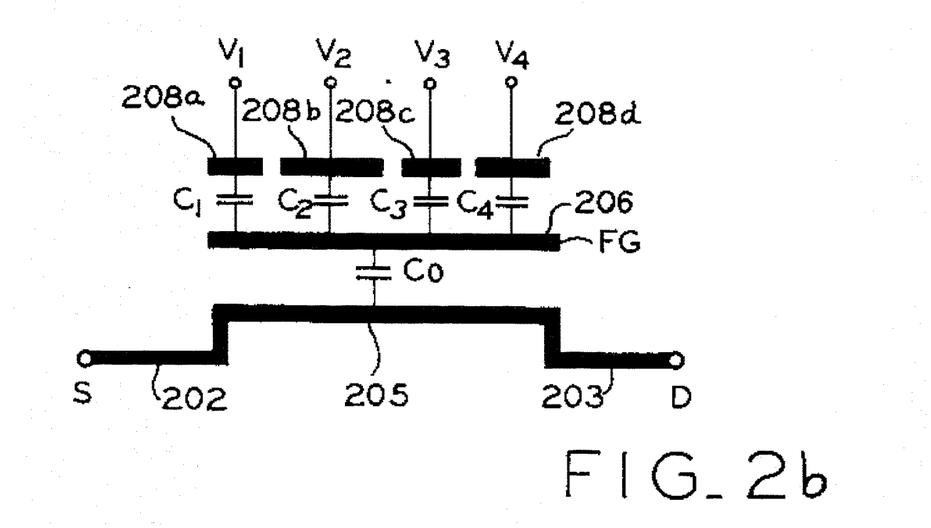
FIG. 2(b) shows the content of FIG. 2(a) in simplified form for the purposes of analysis of the vMOS operation.

In order to explain the operation of the circuitry of FIG. 1(b), the construction and basic operating principle of the vMOS will first be explained. FIG. 2(a) shows an example of the cross-sectional construction of a 4-input N-channel vMOS transistor (N-vMOS); reference 201 indicates a P-type silicon substrate, references 202 and 203 indicate the source and drain which are formed by $N^+$ diffusion layers, reference 204 indicates a gate insulating film (for example, a $SiO_2$ film) which is provided on the channel region 205 between the source and the drain, reference 206 indicates a floating gate electrode which is electrically insulated and is in a potentially floating state, reference 207 indicates an insulating film comprising, for example, $SiO_2$ or the like, and references 208a, 208b, 208c, and 208d indicate input gate electrodes. FIG. 2(b) shows a simplification of this structure for the purposes of explaining the operation of the vMOS. If the capacitive coupling coefficient between each input gate electrode and the floating gate is represented, as shown in the Figure, by $C_1$, $C_2$, $C_3$, and $C_4$, and the capacitive coupling coefficient between the floating gate and the silicon substrate is represented by $C_0$, then the potential $\phi_F$ of the floating gate is given by the following formula.

$$\phi_F=(1/C_{TOT})(C_1V_1+C_2V_2+C_3V_3+C_4V_4)$$

That is to say, $$C_{TOT}=C_0+C_1+C_2+C_3+C_4$$

References $V_1$, $V_2$, $V_3$, and $V_4$ represent voltages which are applied to, respectively, input gates 208a, 208b, 208c, and 208d, and the potential of the silicon substrate is 0 V, so that it is grounded.

Now, the potential of source 202 is set to 0 V. That is to say, the potential of all electrodes are set to values measured using the source as a reference. By proceeding in this manner, if the floating gate 206 is seen as a standard gate electrode, then the vMOS shown in FIG. 2 is identical to a standard N-channel MOS transistor, and when the gate potential $\phi_F$ thereof becomes larger than the threshold value ($V_{TH}^*$), then an electron channel (N-channel) is formed in the region 205 between source 202 and drain 203, and the source and the drain are electrically connected. That is to say, when the condition $$(1/C_{TOT})(C_1V_1+C_2V_2+C_3V_3+C_4V_4)>V_{TH}^*$$

is met, the vMOS enters an ON state.

The above explanation related to a N-channel vMOS transistor; however, there are also devices in which the source 202, drain 203, and substrate 201 in FIG. 2(a) all have opposite conductivity. That is to say, in this vMOS, the substrate is of the N type, while the source and the drain are formed from $P^+$ diffusion layers, and this is termed a P-channel MOS transistor (P-vMOS).

Figure 1C:
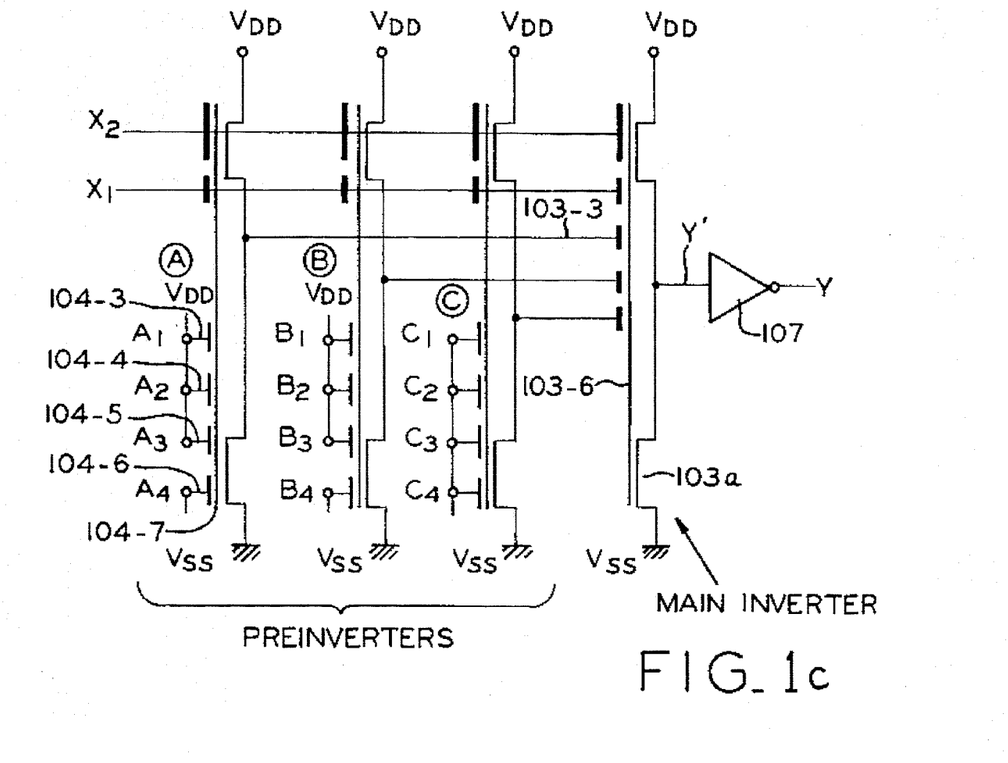
FIG. 1(c) is a diagram showing the input of the preinverter.

In FIG. 1(a), for example, in block 101d, the inputs of the preinverter are wired within the block in the manner shown in FIG. 1(c), so that the circuit calculates:

$$Y=X_1 \oplus X_2 \quad (1)$$

In other words, the circuit calculates the EXCLUSIVE NOR of $X_1$ and $X_2$.

Next, an explanation will be given with respect to the operation of the circuitry shown in FIG. 1(c). Now, if the potential $\phi_F$ of the floating gate 104-7 of preinverter A is calculated, the following results:

$$\phi_F=(C_1X_2+C_2X_1+C_3A_1+C_4A_2+C_5A_3+C_6A_4)/C_{TOT}=(V_{DD}/7)(2X_2+X_1+A_1+A_2+A_3+A_4) \quad (3)$$

However, for the purposes of simplicity, since $C_0 \ll C_{TOT}$, $C_0$ is ignored.

Figure 1D:
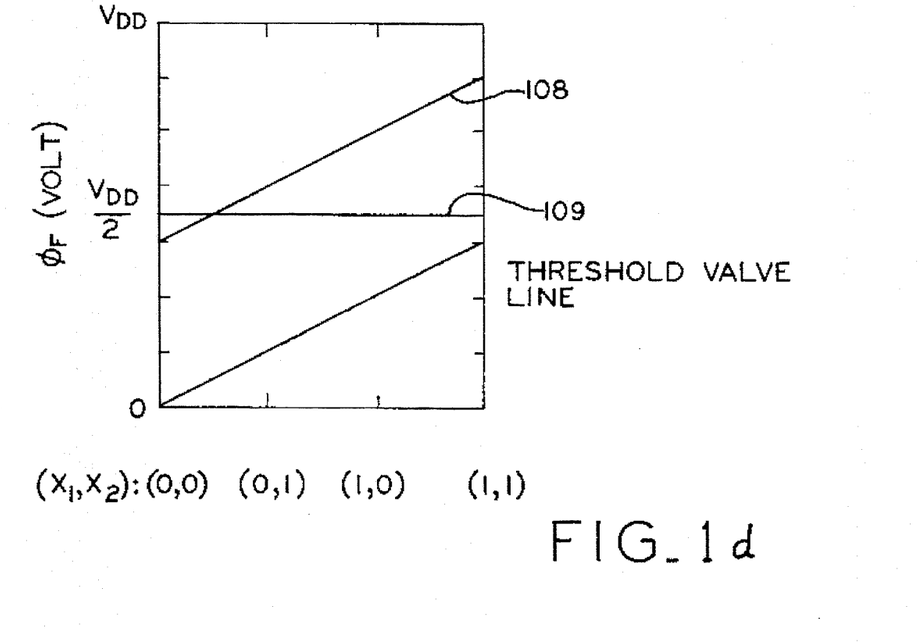
FIG. 1(d) is a diagram showing plots of $\phi_F$ with respect to combinations of $(X_1, X_2)$

Since $A_1=A_2=A_3V_{DD}$, and $V_4=0$, then formula (3) gives $\phi_F=(V_{DD}/7)(2X_2+X_1+3)$ (4)

and a plot of $\phi F$ with respect to combinations of $(X_1,X_2)$ results in the straight line 108 shown in FIG. 1(d). In the Figure, the threshold value line 109 indicates the inversion voltage of the inverter, and this is set to (½) $V_{DD}$ with respect to all inverters. That is to say, inverter A does not invert with respect to an input of $(X_1,X_2)=(0,0)$, and outputs V; however, with respect to an input of (0,1), (1,0), or (1,1), the inverter inverts, and the output has a value of 0. This output is then inputted into the input gate 103-3 of the main inverter.

Figure 1E:
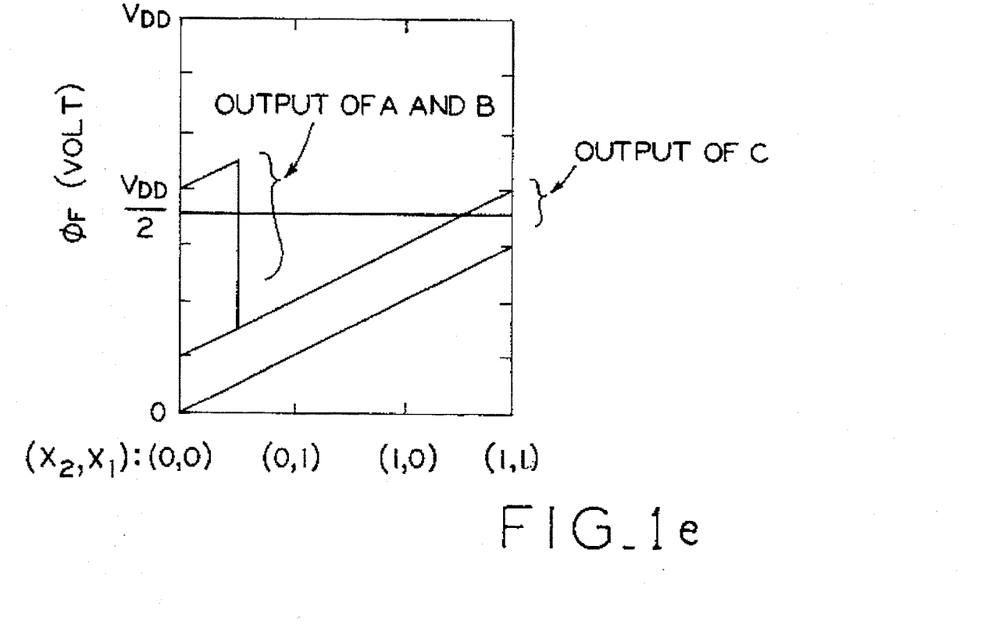
FIG. 1(e) is a diagram showing the potential $\phi_F$ of floating gate 103-6 of the main inverter with respect to combinations of $(X_1, X_2)$.

The same observations were conducted with respect to inverters B and C, and in FIG. 1(e), the potential $\phi_F$ of the floating gate 103-6 of the main inverter is shown with respect to combinations of $(X_1,X_2)$; in the Figure, the effect of the output of inverters A, B, and C is clearly shown. From this Figure, it can be seen that the main inverter only inverts when $(X_1,X_2)=(0,0)$ or (1,1), and at this time, Y'=0, while Y=1. That is to say, this same circuit determines XNOR.

In the same way, the circuit shown in FIG. 1(b) is capable of realizing all Boolean functions by connecting $A_1$–$A_4$ and the like to $V_{DD}$ or $V_{SS}$. The appropriate connection patterns for realizing circuits such as, for example, AND, OR, NAND, NOR, EXCLUSIVE NOR, EXCLUSIVE OR, INHIBIT, or the like are shown in Table 1.

Figure 1F:
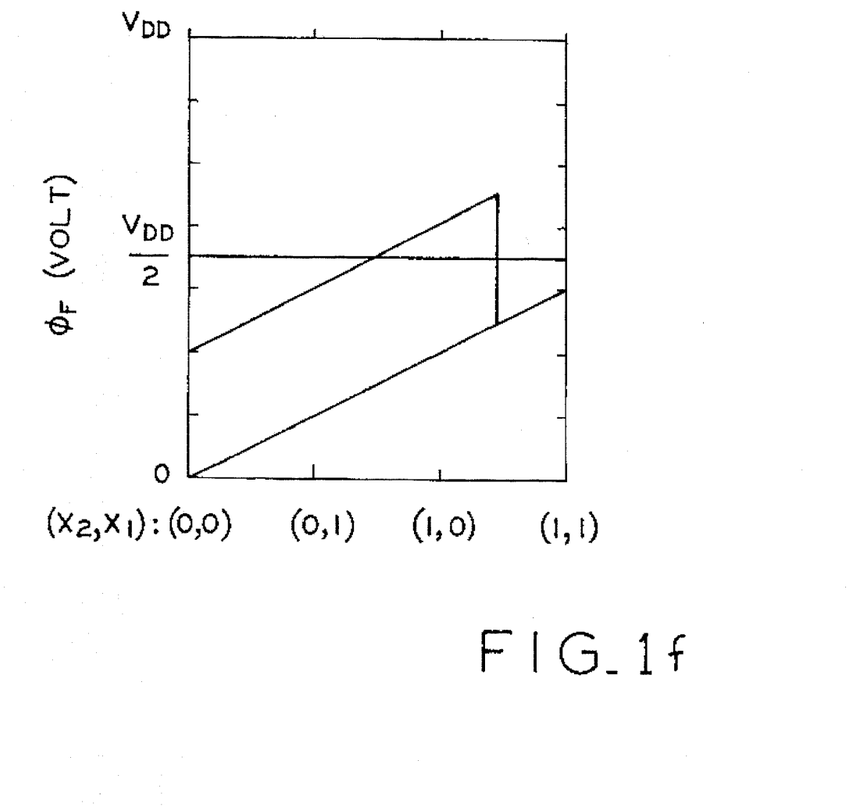
FIG. 1(f) is a diagram showing the change in $\phi_F$ of the main inverter.

What is meant by INHIBIT is a function termed the inhibiting gate; when $X_2=0$, the output has a constant value of 0, while when $X_2=1$, then the circuit functions as an inverter with respect to $X_1$. The changes in $\phi_F$ of the main inverter for the purposes of realizing this circuit are shown in FIG. 1(f).

Figure 1G:
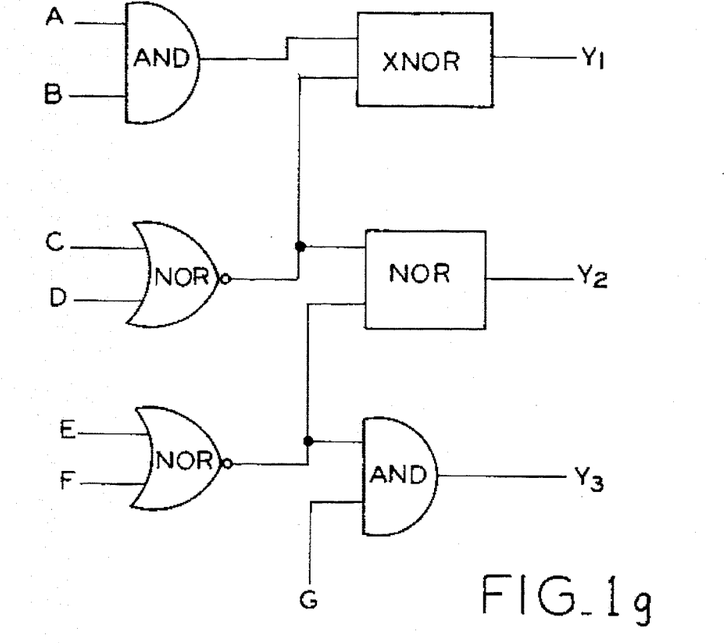
FIG. 1(g) shows, in logical notation, an example in which predetermined connections were performed with respect to the blocks shown in FIG. 1(a).

FIG. 1(g) shows, in logical notation, an example in which predetermined connections were conducted with respect to each block in FIG. 1(a). It should be clear that any logical function can be realized simply by altering the connections within each block.

In accordance with the present invention, LSIs can be test-manufactured using the same mask (reticle) until the Al wiring is conducted, and a mask having special properties can be used for only the Al pattern, so that logical circuits can be produced in exactly the same manner as with a gate array. However, the basic circuitry shown in FIG. 1(b) is used in place of combining simple transistors as in the gate array, so that it is possible to realize all Boolean functions with respect to two inputs $X_1$ and $X_2$ in blocks having the same construction, and circuit design is also extremely simple. Furthermore, if, as shown in FIG. 1(c), the gate electrodes 104-3, 104-4, 104-5, and 104-6 are, for example, made of polysilicon, then the wiring determining the function in the respective blocks can be set by simply connecting a number of the various contacts to $V_{DD}$ and $V_{SS}$, so that the circuit can be realized by means of an extremely simple one-layer Al wiring. It is of course the case that two or more layers of metallic wiring may also be employed. In such a case, the degree of freedom in the wiring 102 between blocks would particularly increase, and furthermore, the construction of logic circuits would become simpler.

Figure 1H:
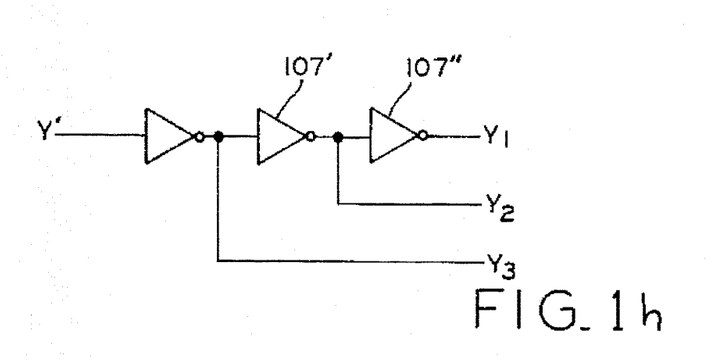
FIG. 1(h) and FIG. 1(i) show modified examples relating to the output.

In the circuitry of FIG. 1(b), a standard inverter 107 is provided; however, this is not necessarily required, and may be omitted. Alternatively, furthermore, more than one stage may be added. In such a case, a greater fan-out may be employed, where necessary. Additionally, as shown in FIG. 1(h), a number of stages of inverters 107', 107", or the like may be added, and the respective outputs may be extracted. At this time, if the output transistors of 107' and 107" are made large, a large fan-out can be obtained, and, where necessary, the output line may be selected. Furthermore, it is possible to freely select either a normal or an inverted output, and thus the degree of freedom of logic design is further increased.

Figure 1I:
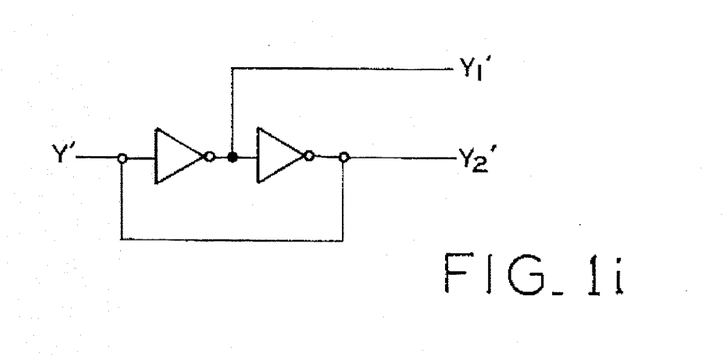

Furthermore, it is of course the case that flip-flops may be added to the output stage, as shown in FIG. 1(i).

With respect to inverters A, B, C, and the like, as well, input may be conducted into the main inverter via one or more stages of standard inverters.

Furthermore, it is not necessary that the floating gate be constantly in a floating state; it may be connected via a switch to, where appropriate, $V_{DD}$ or $V_{SS}$, or to other potentials.

Furthermore, it is of course the case that the circuitry as a whole may be operated synchronously with a clock.

Furthermore, the four input gates $A_1$–$A_4$ may be replaced with two input gates $A_1'$ and $A_2'$, and the coupling capacities $C_3'$ and $C_4'$ thereof may be selected so that $C_3':C_4'=1:2$. However, setting is conducted at this time so that $C_3'+C_4'=C_3+C_4+C_5+C_6$. By proceeding in this manner, it is possible to obtain the same results by connecting the two contact holes to $V_{SS}$ or $V_{DD}$.

Figure 3A:
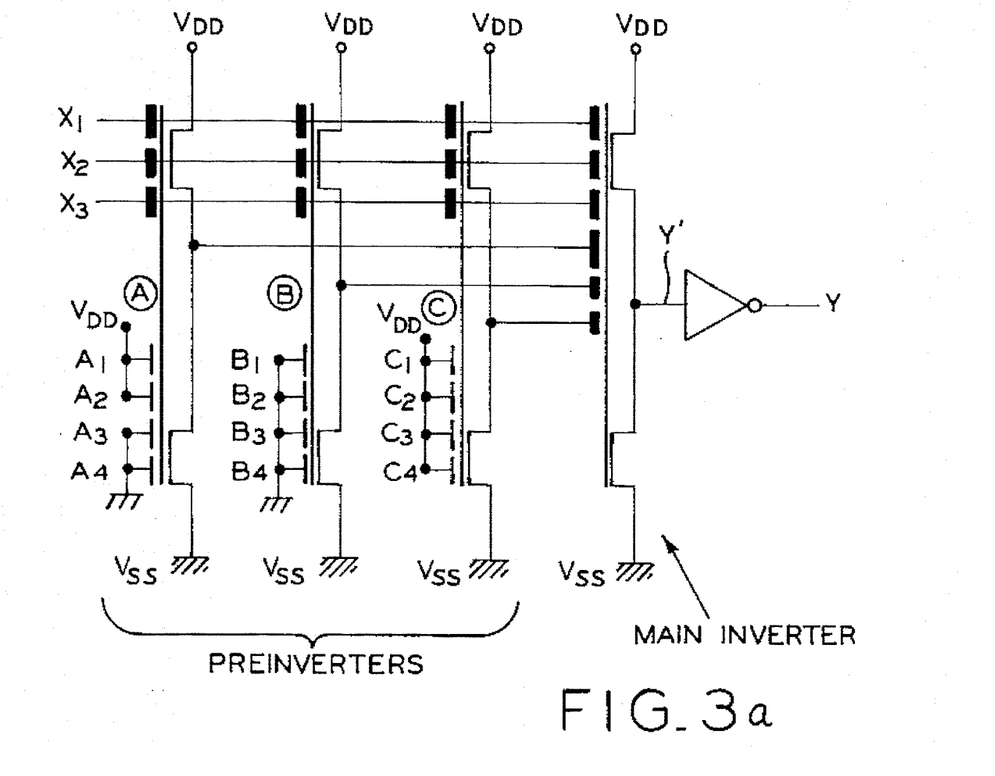
FIG. 3(a) shows a second example of the present invention.

A second embodiment of the present invention is shown in FIG. 3(a).

The difference between this example and the first example lies in that the input of the basic block is a three-bit input consisting of $X_1$, $X_2$, and $X_3$. For example, with respect to preinverter A, if the coupling capacities between inputs $X_1$, $X_2$, $X_3$, $A_1$, $A_2$, $A_3$, and $A_4$ and the floating gate are represented by $C_1$, $C_2$, $C_3$, $C_4$, $C_5$, $C_6$ and $C_7$, then $C_1=C_2=C_3=C_4=C_5=C_6=C_7$.

This is the same in the other inverters B and C. With respect to the main inverters, the input gate capacities are, from the top in descending order, 1:1:1:2:1:1.

Figure 3B:
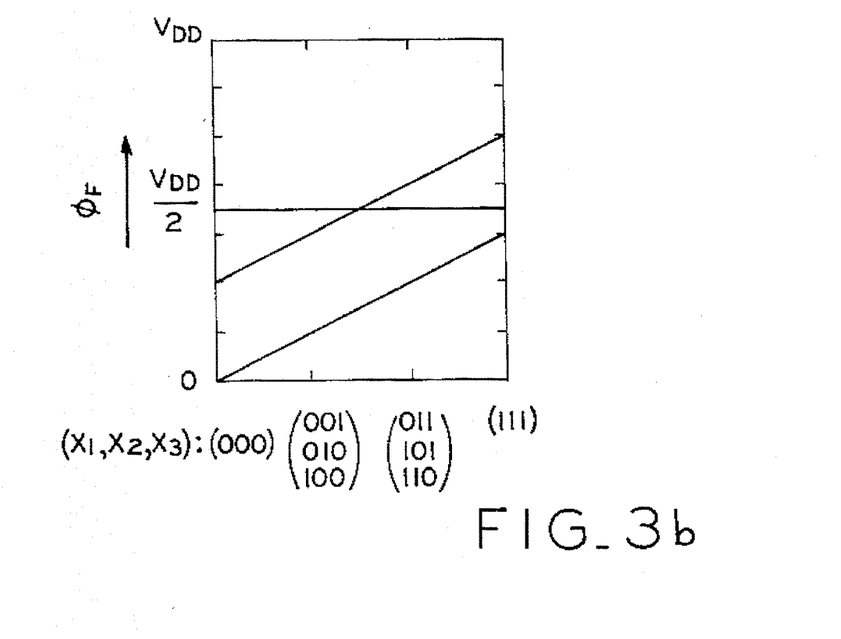
FIG. 3(b) shows the relationship between the $\phi_F$ of preinverter A and $X_1$, $X_2$, and $X_3$.

It is assumed that, as shown in FIG. 3(a), $A_1$–$A_4$, $B_1$–$B_4$, and $C_1$–$C_4$ are connected. The relationship between the $\phi_F$ of preinverter A and $X_1$, $X_2$, and $X_3$ is shown in FIG. 3(b).

Figure 3C:
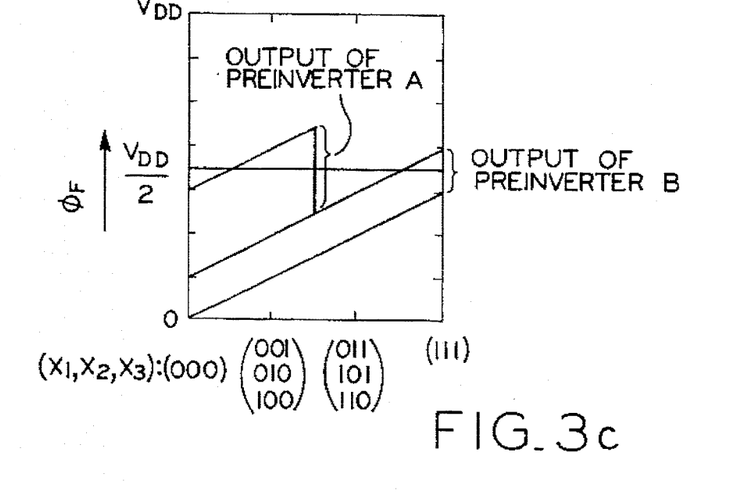
FIG. 3(c) shows the changes in the $\phi_F$ of the main inverter.

Since the coupling capacities of $X_1$, $X_2$ and $X_3$ are all identical, the value of $\phi_F$ is determined solely by how many of these three inputs have a value of 1. That is to say, preinverter A inverts when two or more values of 1 are present, and outputs a value of 0. A similar observation reveals that the output of preinverter B has a constant value of 1($V_{DD}$), and the output of preinverter C has a constant value of 0. Accordingly, the value $\phi_F$ of the main inverter is as shown in FIG. 3(c), and the inverter inverts only when the number of values of 1 among the inputs is one or three, so that Y'=0, that is to say, Y=0. In other words, $Y=X_1+X_2+X_3$; that is to say, Y represents the EXCLUSIVE OR of the three inputs $X_1$, $X_2$, and $X_3$.

In conventional circuitry, forty transistors were necessary; however, this circuit is realized with only ten transistors. That is to say, circuits which were extremely complicated when realized using a conventional gate array can be realized in an extremely simple manner. This is an important advantageous feature of the present invention.

The circuitry of FIG. 3(a) is capable of realizing all sixteen symmetrical functions with respect to three input signals.

Figure 3D:
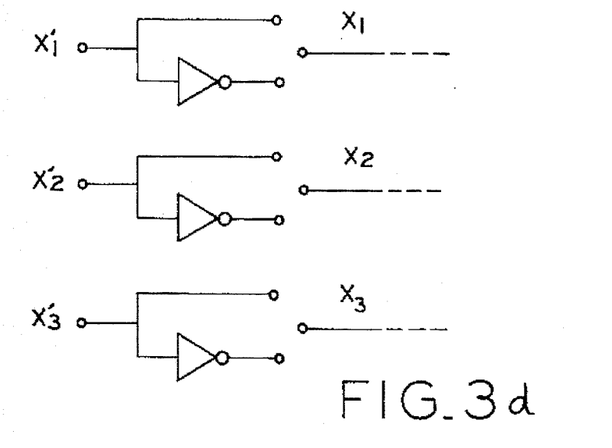
FIG. 3(d) and FIG. 3(e) show input examples of the circuitry.

Furthermore, as shown in FIG. 3(d), if the three inputs $X_1'$, $X_2'$, and $X_3'$ may be selected so as to either pass through an inverter or not by means of the aluminum pattern, then in addition to all symmetrical functions, 128 functions, including some non-symmetrical functions, may be realized using the same circuitry, so that the degree of freedom is increased.

In addition, a RAM pattern may be provided on the same chip and a memory function thus added, and commonly used microprocessors may be integrated on the same chip.

A number of blocks may be left unwired, and may be used as spares to replace blocks which are found to be defective or the like and inoperative after the function test. This is the concept of chip rescue in logic circuits by means of REDUNDANCY, and was previously only realizable with memory. The present invention is truly epoch-making in that it realizes REDUNDANCY rescue using logic circuits, as well.

Furthermore, it is not necessary that all the circuit blocks of FIG. 1(b), FIG. 3(a), or the like be constructed with the same pattern. It is of course the case that the basic circuit construction may be common. Where necessary, a block comprising large size transistors may be disposed at the output stage.

| Circuit Function | Connection Pattern | | | | | | | | | | | | Output Y $(X_2, X_1)$: | | | |
|---|---|---|---|---|---|---|---|---|---|---|---|---|---|---|---|---|
| | $A_1$ | $A_2$ | $A_3$ | $A_4$ | $B_1$ | $B_2$ | $B_3$ | $B_4$ | $C_1$ | $C_2$ | $C_3$ | $C_4$ | (0, 0) | (0, 1) | (1, 0) | (1, 1) |
| AND | + | + | + | + | + | + | + | + | 0 | 0 | 0 | 0 | 0 | 0 | 0 | 1 |
| OR | 0 | 0 | 0 | 0 | 0 | 0 | 0 | 0 | + | + | + | + | 0 | 1 | 1 | 1 |
| NAND | 0 | 0 | 0 | + | 0 | 0 | 0 | + | 0 | 0 | 0 | + | 1 | 1 | 1 | 0 |
| NOR | 0 | + | + | + | 0 | + | + | + | 0 | + | + | + | 1 | 0 | 0 | 0 |
| EXCLUSIVE NOR | 0 | + | + | + | 0 | + | + | + | 0 | 0 | 0 | 0 | 1 | 0 | 0 | 1 |
| EXCLUSIVE OR | 0 | 0 | 0 | + | 0 | 0 | 0 | + | + | + | + | + | 0 | 1 | 1 | 0 |
| INHIBIT | 0 | + | + | + | + | + | + | + | + | + | + | + | 0 | 0 | 1 | 0 |

0 indicates connection to $V_{SS}$,
+ indicates connection to $V_{DD}$.

Figure 3E:
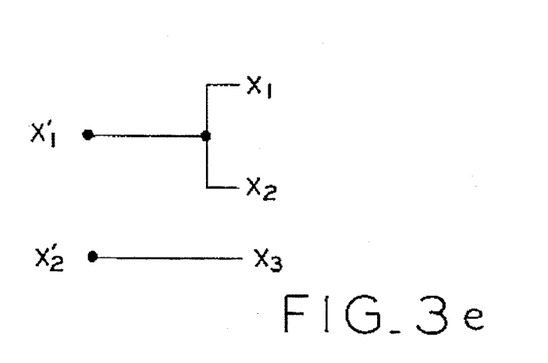

Furthermore, if the inputs of circuitry identical to that of FIG. 3(a) are set so that, as shown in FIG. 3(e), the same signal $X_1'$ is inputted as $X_1$ and $X_2$, then the circuit is capable of realizing all Boolean functions with respect to two inputs $X_1'$ and $X_2'$ identical to those of FIG. 1(b).

That is to say, if the block of FIG. 3(a) is employed, then the block is extremely flexible, being adaptable to all three-input symmetrical functions and all two-input functions.

The foregoing embodiment described the case of three inputs; however, it is of course the case that blocks having more input may be prepared.

For example, a circuit which is capable of realizing all 512 symmetrical functions of 8 inputs can be constructed by means of similar circuitry having 9 preinverter stages and 1 inverter stage. If such circuitry is set so that the inversion or noninversion of the inputs may be selected at the input stage, as in FIG. 3(d), then 131,072 functions may be realized using the same block.

Furthermore, if two inputs and four inputs are bundled as in FIG. 3(e), and used as one input, then the circuit can be used to realize all three-input functions.

By means of the present invention, it becomes possible to construct custom LSIs extremely readily, and it is possible to dramatically advance the construction of logic circuits.

In the present embodiment, only the construction of random logic circuits was discussed; however, it is of course the case that outputs may be fed back into the input stage in a portion of the circuitry, and wiring enabling a memory function may be formed.

INDUSTRIAL APPLICABILITY

By means of the present invention, it is possible to construct any logic circuit using a common mask with the exception of a mask of metallic wiring, and it is possible to dramatically improve the performance of custom LSIs.

We claim:

1. A semiconductor integrated circuit, comprising:

a logic circuit having a plurality of input terminals and an output terminal, said logic circuit comprising a plurality of circuit blocks having identical circuit structure, each said circuit block comprising inverters formed by neuron MOS transistors, wherein each said neuron MOS transistor comprises a semiconductor region of one conductivity type disposed on a substrate, a source region and a drain region of a conductivity type opposite to said semiconductor region provided on said semiconductor region, a floating gate electrode having a floating potential and isolated from said source region and said drain region, said floating gate electrode capacitively coupled to said semiconductor region by means of a first insulating film, and a plurality of control gate electrodes capacitively coupled to said floating gate electrode by means of a second insulating film, each said circuit block associated with a wiring pattern wherein said wiring pattern determines the logic function of each associated said circuit block.

2. A semiconductor integrated circuit in accordance with claim 1, characterized in that said input signal is a binary signal having a value of 1 to 0, and said circuit block is constructed so that said function type may be realized as any Boolean function which is possible with respect to said input signal.

3. A semiconductor integrated circuit in accordance with claim 1, characterized in that said input signal is a binary signal having a value of 1 to 0, and said circuit block is constructed so that said function is realizable as any symmetrical Boolean function which is possible with respect to said input signal.

4. A semiconductor integrated circuit in accordance with claim 1, further comprising an unwired circuit block, said unwired circuit block identical to each said circuit block, said unwired circuit block lacking an associated wiring pattern, said unwired circuit block capable of replacing any said circuit block.

5. A semiconductor integrated circuit in accordance with claim 3 wherein an identical signal is inputted into $2^n$ input terminals and wherein n represents zero or a positive interger.

* * * * *